United States Patent
Tang et al.

(10) Patent No.: US 9,590,157 B2
(45) Date of Patent: Mar. 7, 2017

(54) EFFICIENT DUAL METAL CONTACT FORMATION FOR A SEMICONDUCTOR DEVICE

(71) Applicant: THE SILANNA GROUP PTY LTD., Eight Mile Plains (AU)

(72) Inventors: Johnny Cai Tang, Baulkham Hills (AU); Christopher Flynn, Lane Cove (AU)

(73) Assignee: The Silanna Group Pty Ltd, Eight Mile Plains (AU)

( * ) Notice: Subject to any disclaimer, the term of this patent is extended or adjusted under 35 U.S.C. 154(b) by 0 days.

(21) Appl. No.: 14/730,500

(22) Filed: Jun. 4, 2015

(65) Prior Publication Data

US 2016/0359094 A1    Dec. 8, 2016

(51) Int. Cl.
*H01L 21/4763* (2006.01)
*H01L 33/62* (2010.01)

(52) U.S. Cl.
CPC ...... *H01L 33/62* (2013.01); *H01L 2933/0066* (2013.01)

(58) Field of Classification Search
CPC ............ H01L 33/62; H01L 2933/0066
See application file for complete search history.

(56) References Cited

U.S. PATENT DOCUMENTS

| | | | |
|---|---|---|---|
| 3,942,243 A | 3/1976 | Murray | |
| 5,776,829 A | 7/1998 | Homma et al. | |
| 6,866,943 B2 | 3/2005 | Friese et al. | |
| 7,183,579 B2 | 2/2007 | Chae et al. | |
| 7,470,611 B2 | 12/2008 | Huang | |
| 8,013,414 B2 | 9/2011 | Zhu | |
| 8,039,854 B2 | 10/2011 | Hersee et al. | |
| 2012/0273823 A1* | 11/2012 | Yoneda | H01L 33/38 257/98 |

FOREIGN PATENT DOCUMENTS

| | | |
|---|---|---|
| JP | 2011086928 A | 4/2011 |
| JP | 2013041978 A | 2/2013 |
| JP | 2013131515 A | 7/2013 |
| JP | 2014154693 A | 8/2014 |
| JP | 2014241401 A | 12/2014 |

OTHER PUBLICATIONS

L. Zhou et al., "Low resisance Ti/Pt/Au ohmic contacts to p-type GaN", Appl. Phys. Lett., 76/23, Jun. 5, 2000, pp. 3451-3453.

(Continued)

*Primary Examiner* — Stephen W Smoot
*Assistant Examiner* — Vicki B Booker
(74) *Attorney, Agent, or Firm* — The Mueller Law Office, P.C.

(57) ABSTRACT

A method of forming contacts to an n-type layer and a p-type layer of a semiconductor device includes depositing a dielectric layer on the n-type layer and the p-type layer. A pattern is formed in the dielectric layer, the pattern having a plurality of metal contact patterns for the semiconductor device. A first metal layer is deposited into the plurality of metal contact patterns, and a second metal layer is deposited directly on the first metal layer. External contacts for the semiconductor device are formed, where the external contacts include the second metal layer.

16 Claims, 11 Drawing Sheets

(56) References Cited

OTHER PUBLICATIONS

L. Zhou et al., "Ti/Pt/Au ohmic contacts on p-type GaN/AlxGa1-xN superlattices", Electronics Letters, Jan. 6, 2000, vol. 36/No. 1, pp. 91-93.
M.E. Lin, et al., "Low resistance ohmic contacts on wide band-gap GaN", Appl. Phys. Lett., 64(8), Feb. 21, 1998, pp. 1003-1005.
Munsik Oh, et al., "Highly reflective Ti/Ag/Pt contacts to a p—GaN for high-efficiency GaN-based light-emitting diodes", Jpn. J. Appl. Phys., 54, 2015, pp. 1-5.
Q.Z. Liu et al., "Study of contact formation in AlGaN/GaN heterostructures", Applied Physics Letters, 71, 1658 (1997), pp. 1658-1660.
Hirayama et al. "231-261 nm AlGaN deep-ultraviolet light-emitting diodes fabricated on AlN multilayer buffers grown by ammonia pulse-flow method on sapphire" Applied Physics Letters 91 071901 (2007).
S. Gonzales et al. "Performance of a sequentially deposited Ti/TiN/AlCuSi Metallization Structure" Proc. 1991 IEEE VLSI Multilevel Interconnect Conf. (Jun. 11-12, 1991) pp. 316-319.
International Search Report and Written Opinion dated Sep. 5, 2016 for PCT Patent Application No. PCT/IB2016/053196.

\* cited by examiner

EFFICIENT DUAL METAL CONTACT FORMATION FOR A SEMICONDUCTOR DEVICE

BACKGROUND OF THE INVENTION

Metallization processes in semiconductor device manufacturing provide electrical contact points for a semiconductor device. Metallization processes represent a nontrivial materials engineering challenge in that the physical contact between the semiconductor material and the metallization can drastically affect the performance of the contact. In addition, certain metals are not compatible with additional processing steps that must be conducted after the metallization process has been conducted. Patterning the metal is also challenging, and multiple steps are required to form the metallization contacts. For example, the formation of the metallization contacts is often performed using a metal lift-off technique, which involves various process steps to apply a photoresist, pattern the photoresist, deposit the metal, and strip the sacrificial material and extraneous target material.

SUMMARY

A method of forming contacts to an n-type layer and a p-type layer of a semiconductor device includes depositing a dielectric layer on the n-type layer and the p-type layer. A pattern is formed in the dielectric layer, the pattern having a plurality of metal contact patterns for the semiconductor device. A first metal layer is deposited into the plurality of metal contact patterns, and a second metal layer is deposited directly on the first metal layer. External contacts for the semiconductor device are formed, where the external contacts include the second metal layer.

DETAILED DESCRIPTION OF THE EMBODIMENTS

Metallization of semiconductor devices, such as in forming contacts for the device, typically requires multiple processes that can be costly and time-consuming. For example, in ultra-violet light emitting diodes (UV LED), metallization typically requires two separate steps for forming the n-contact metal and forming the p-contact metal. A third metallization step may also be required to form a thick metal layer to enable external contacts from a package to the n and p device contacts. Different metal stacks are typically used for the n and p contacts, thus requiring separate processes to deposit the different metals. The n-contact and p-contact use lift-off processes for creating low-resistance Ohmic contacts to the device, whereas the thick metal step is an etch-based process for facilitation of device packaging. Thus conventionally, the metallization process is divided in up to three different process steps—two lift-off processes and an etch-based process. Furthermore, each of these process steps involves at least one photolithography step.

In the present disclosure, a process is described for forming the n-contact metal, p-contact metal and thick metal layers in the same process step. Performing the full metallization process in a single step reduces the cost and time required to process semiconductor devices such as UV LED wafers. The methods include forming the contacts with dual metal layers, where the two layers of metal are formed in an efficient manner. Although the embodiments shall be described in terms of an LED device, the methods are applicable to other types of semiconductor devices such as bipolar transistors, and including other opto-electronic devices such as photodiodes, laser diodes and solar cells.

Figure 1A:
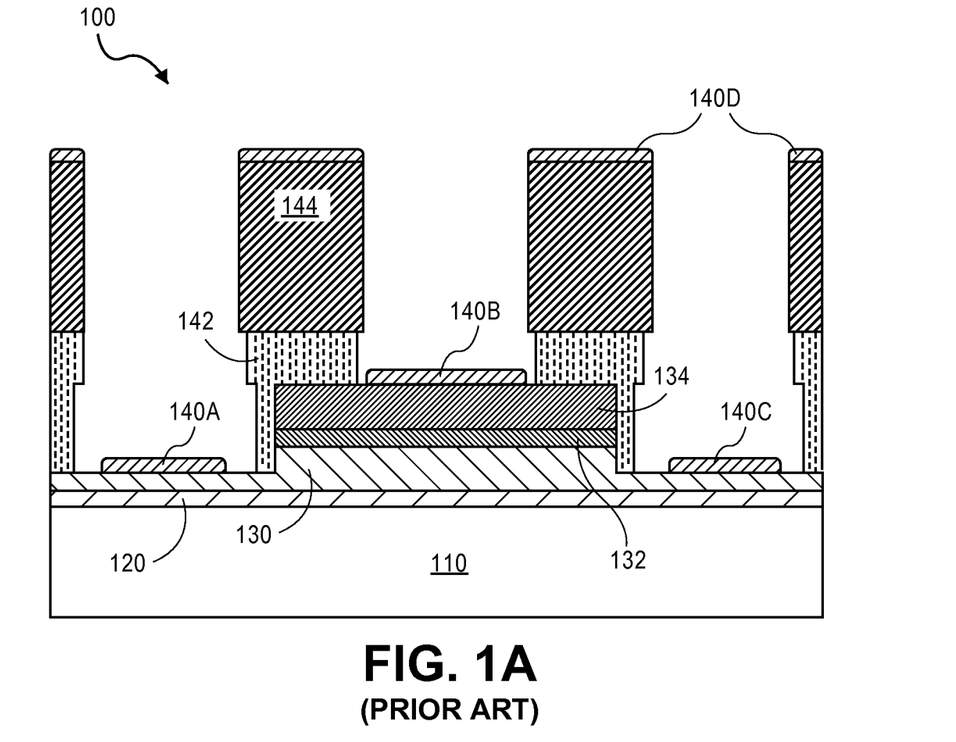
FIGS. 1A-1G show metallization process steps as known in the art.
Figure 1B:
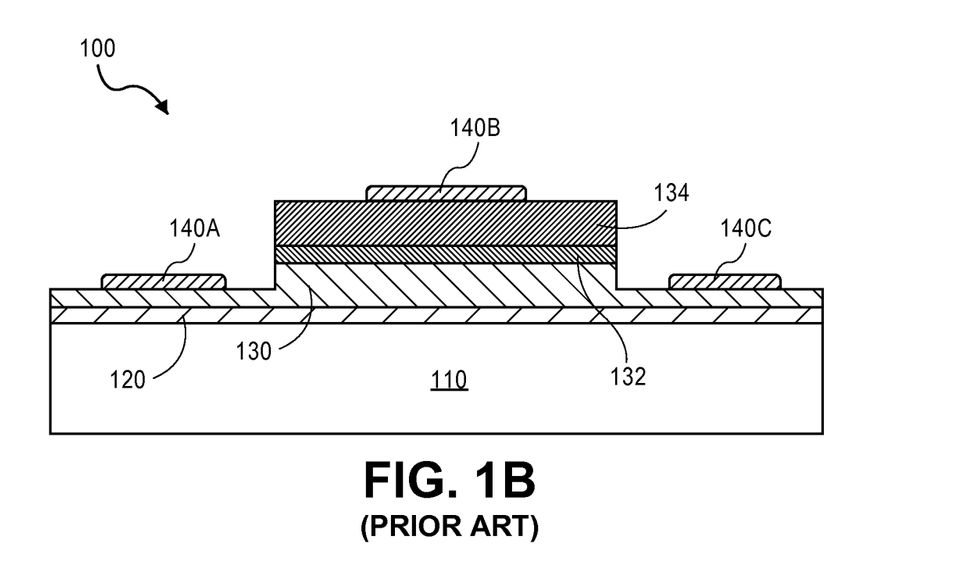

FIGS. 1A-1G depict a typical metallization process as known in the art. In FIGS. 1A-1B, an LED device 100 includes a substrate 110, a buffer layer 120, an n-type layer 130, an intrinsic layer 132 and a p-type layer 134. Substrate 110 may be, for example, silicon, sapphire, silicon carbide, or a group III-nitride such as aluminum nitride. In an opto-electronic device, intrinsic layer 132, which is between the n-type layer 130 and p-type layer 134, may also be referred to as a light generating structure of the device 100. LED device 100 also includes n-contacts 140a and 140c, and p-contact 140b, which are conventionally formed by a metal lift-off technique. That is, to form the n-contacts 140a and 140c, lift-off resist 142 and standard photoresist 144 are first layered onto n-type layer 130 and p-type layer 134 of device 100. Lift-off resist 142 and standard photoresist 144 are then exposed and developed to form patterns for the n-contacts 140a and 140c. A desired metal for the n-contacts is then deposited, such that the metal would consequently be deposited onto the top surface of the standard photoresist 144 and into the pattern areas that have been etched away. Next, the lift-off resist 142, standard photoresist 144 and residual contact metal 140d—which is on top of standard photoresist 144 in the unpatterned areas—are removed as shown in FIG. 1B, leaving the formed n-contacts 140a and 140c on the device 100. If different metals are used for the n and p regions, which is typical in the industry, the lift-off process would then be repeated to form p-contact 140b in a separate process step by patterning the p-contact area and then depositing the desired p-contact metal.

Figure 1C:
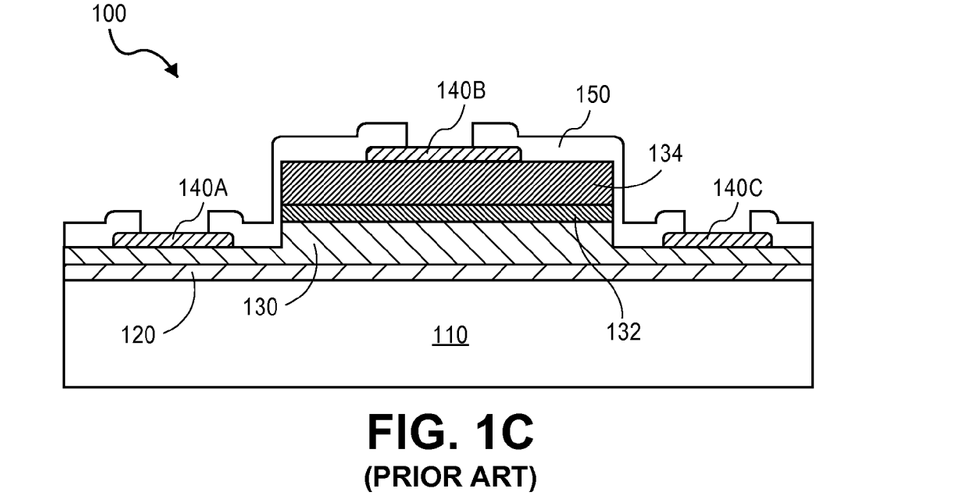
Figure 1D:
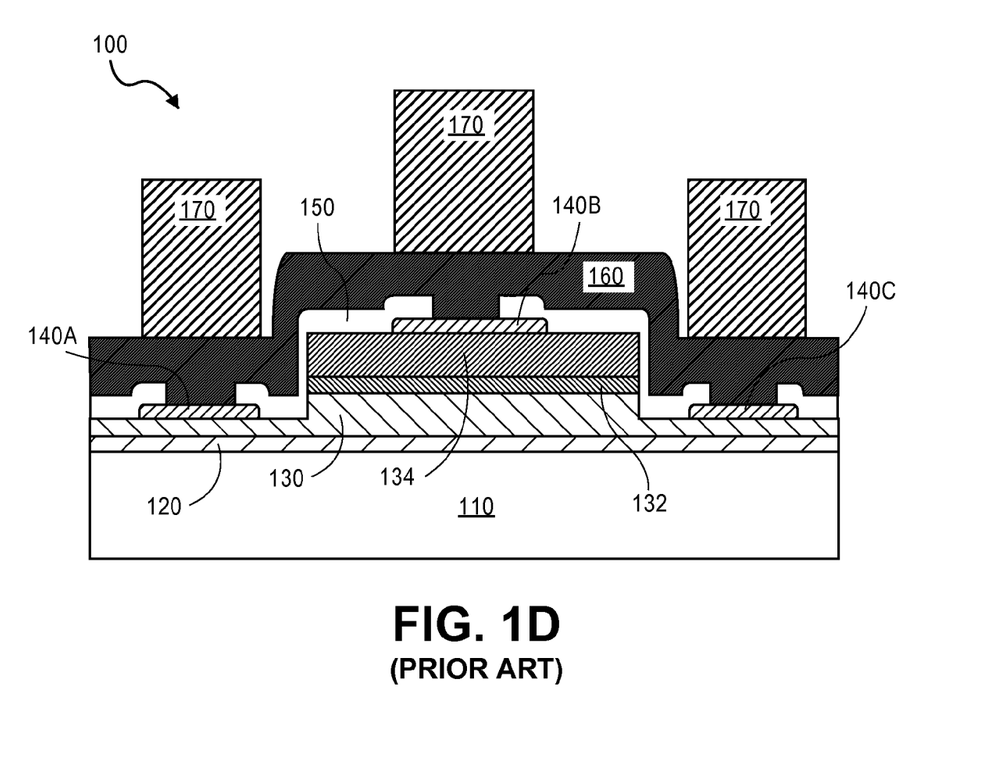

In FIG. 1C, passivation layer 150 is deposited on the top surface of device 100 and patterned, such as by lithography, to form openings over contacts 140a, 140b and 140c. In FIG. 1D, a thick metal layer 160 is deposited onto the passivation layer 150 and onto the exposed areas of contacts 140a, 140b and 140c. Standard photoresist 170 is deposited onto thick metal 160, and patterned using lithography to serve as a photoresist etch mask, such as to form the three discrete patterns over contacts 140a, 140b and 140c as shown in FIG. 1D.

Figure 1E:
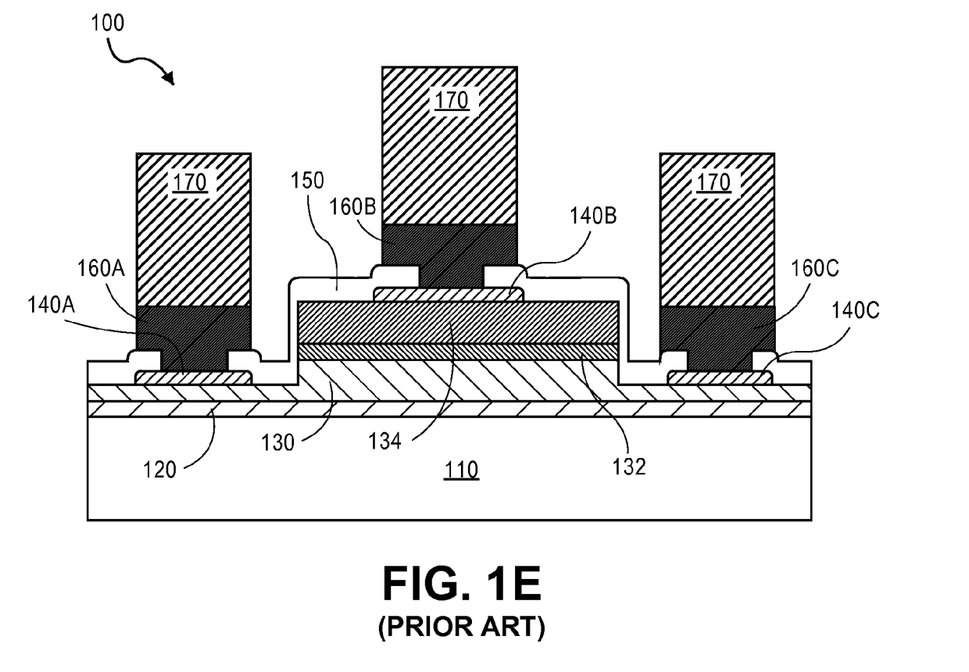
Figure 1F:
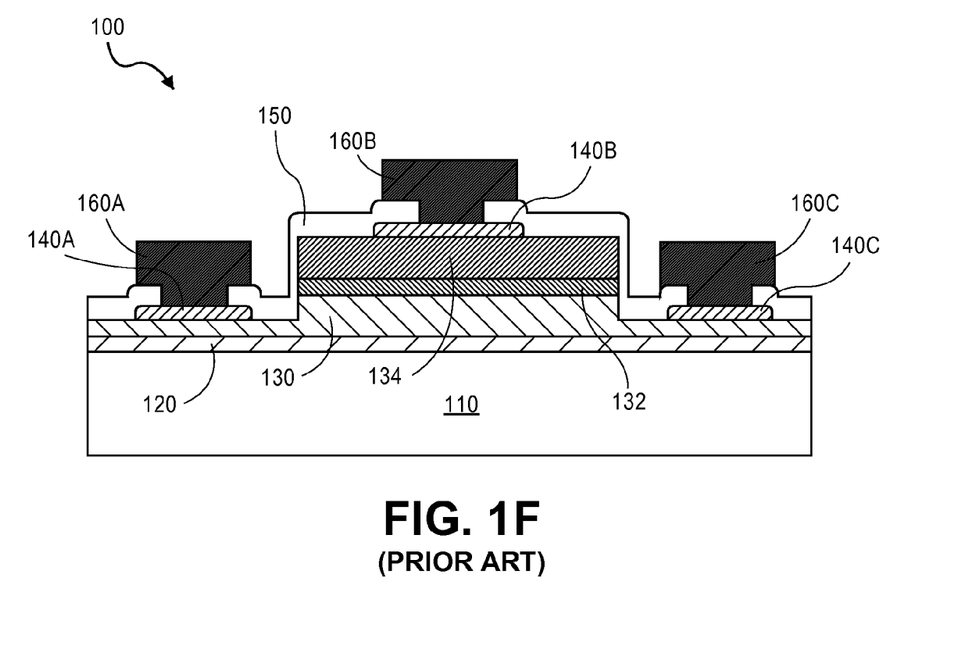
Figure 1G:
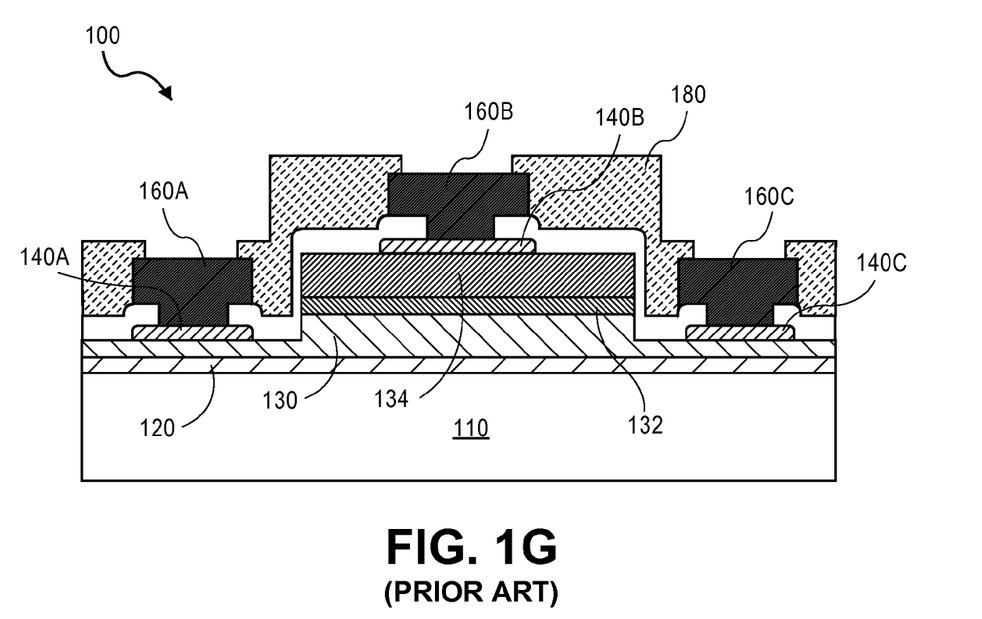

FIG. 1E shows thick metal 160 after etching, such as by a plasma etch, leaving thick metal portions 160a, 160b and 160c over the contacts 140a, 140b and 140c. Thick metal 160 serves as a packaging metal, to enable external contacts between a package and the device 100. In FIG. 1F, the standard photoresist 170 has been stripped off device 100, exposing the packaging contacts formed by thick metal portions 160a, 160b and 160c. In FIG. 1G, passivation layer 180 has been deposited and patterned to provide access to the device contacts formed by 140a/160a, 140b/160b and 140c/160c.

As demonstrated by FIGS. 1A-1B, the conventional metallization process of LED device 100, such as a III-nitride LED, uses a lift-off technique to deposit contact metal layers on the n and p regions. As described earlier in this disclosure, a thick metal layer is often needed for electrically connecting a device to its package. Another aspect of conventional metallization schemes is that they typically employ different metal stacks for the n and p-contacts, which precludes deposition of the contact and thick metal layers in the same step.

The present disclosure includes a metallization scheme in which both the n-contact and p-contact of the device are formed by a first metal layer and a second metal layer. That is, the same metals are used for both the n-contact and p-contact, thus simplifying the metallization into one sequential process. In some embodiments, the first metal may be titanium and the second metal may be aluminum-copper-silicon (AlCuSi). In some embodiments, the methods combine the n-contact metal, p-contact metal and thick metal depositions into a single process step. Use of these methods for the n and p contact metals enables a major process simplification because the n and p contact metals, such as Ti/AlCuSi, can be deposited at the same time. Additionally, deposition of the thick metal layer, such as AlCuSi, can be performed as a continuation of the contact metal in a single process step. Experimentation performed in relation to this disclosure has successfully applied a Ti/AlCuSi metallization scheme for both n and p contacts of III-nitride LEDs, as an example of an application of these methods.

Figure 2A:
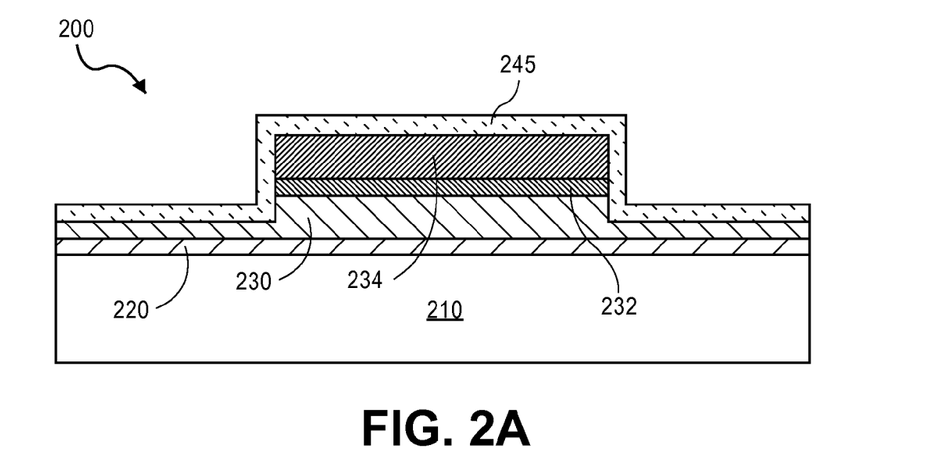
FIGS. 2A-2F show side cross-sectional views of contacts being formed in a semiconductor device, in some embodiments.

FIGS. 2A-2F show an embodiment of forming contacts using methods of the present disclosure. FIG. 2A shows a semiconductor device 200 that includes a substrate 210, a buffer layer 220, an n-type layer 230, an intrinsic layer 232 and a p-type layer 234. Substrate 210 may be, for example, silicon, sapphire, silicon carbide or a group III-nitride such as aluminum nitride. A dielectric layer 245, such as silicon dioxide ($SiO_2$), is deposited on the n-type layer 230 and p-type layer 234.

Figure 2B:
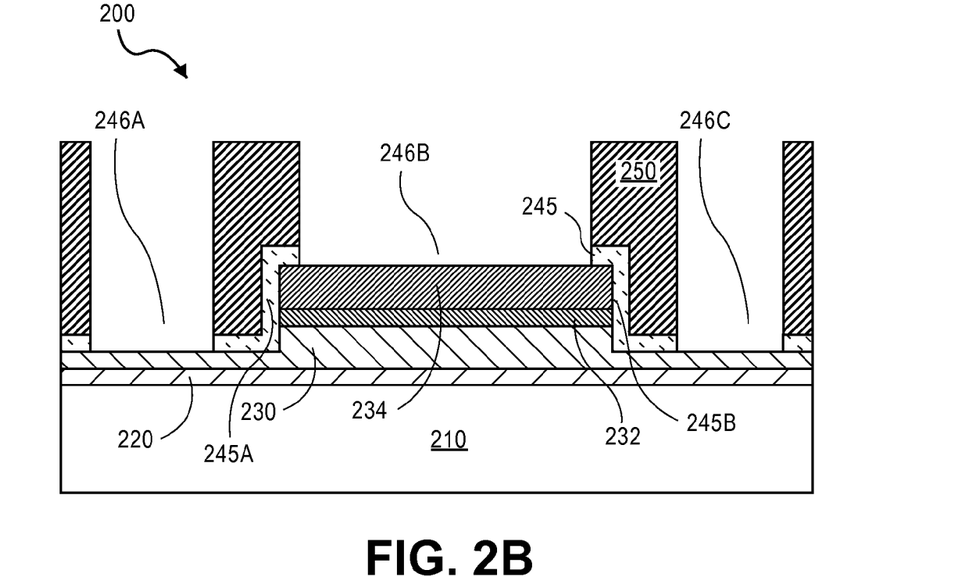
Figure 2C:
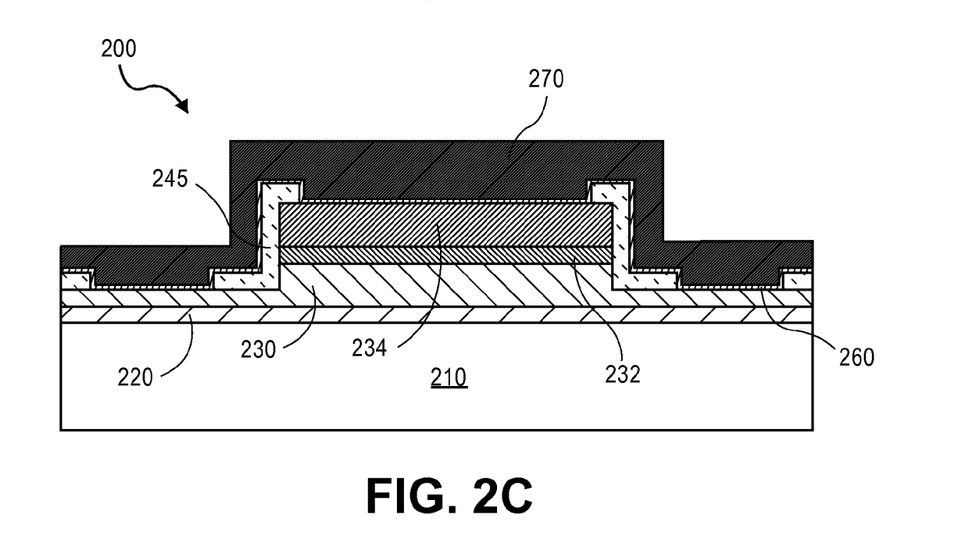

In FIG. 2B, a plurality of metal contact patterns 246a, 246b, and 246c are formed in layer 245. In some embodiments, metal contact patterns 246a, 246b, and 246c include an n-contact and a p-contact for an opto-electronic device. The contact patterns 246a, 246b, and 246c may be formed, for example, by a photoresist mask 250 which is deposited as a layer over dielectric layer 245 and then patterned using a wet chemical or a plasma etch. In the embodiment of FIG. 2B, the dielectric layer covers side walls—that is, the vertical portions 245a and 245b of the opto-electronic device structure. In FIG. 2C, photoresist mask 250 has been removed, and a first metal layer 260 has been deposited into the metal contact patterns 246a, 246b, and 246c and onto dielectric layer 245. In some embodiments, the first metal layer 260 is deposited directly into the metal contact patterns 246a, 246b, and 246c (FIG. 2B), which are p-contact and n-contact patterns. Also in FIG. 2C, a second metal layer 270 is deposited directly on the first metal layer 260. In some embodiments, both first metal layer 260 and second metal layer 270 function as a contact metal for the semiconductor device 200. Second metal layer 270 additionally may serve as a packaging metal. In some embodiments, first metal layer 260 may be, for example, titanium (Ti) having a thickness of up to 100 nm, such as approximately 25 nm. In various embodiments, the second metal layer 270 may be pure Al, AlCu, AlSi, or AlCuSi. In some embodiments, the first metal layer 260 is titanium and the second metal layer 270 is AlCuSi. The second metal layer 270 may have a thickness of, for example, at least 300 nm, such as at least 800 nm in some embodiments, such as approximately 1 micron in certain embodiments. In some embodiments, the first metal layer 260 is at least 99.0% pure titanium. In some embodiments, the first metal layer 260 is titanium of at least 99.0% purity, and the second metal layer is a composition comprising 0-10% copper, 0-5% silicon, and up to 100% aluminum. For example, in one embodiment the second metal may be AlCuSi deposited from an aluminum source containing approximately 1% Si and 0.5% Cu.

Figure 2D:
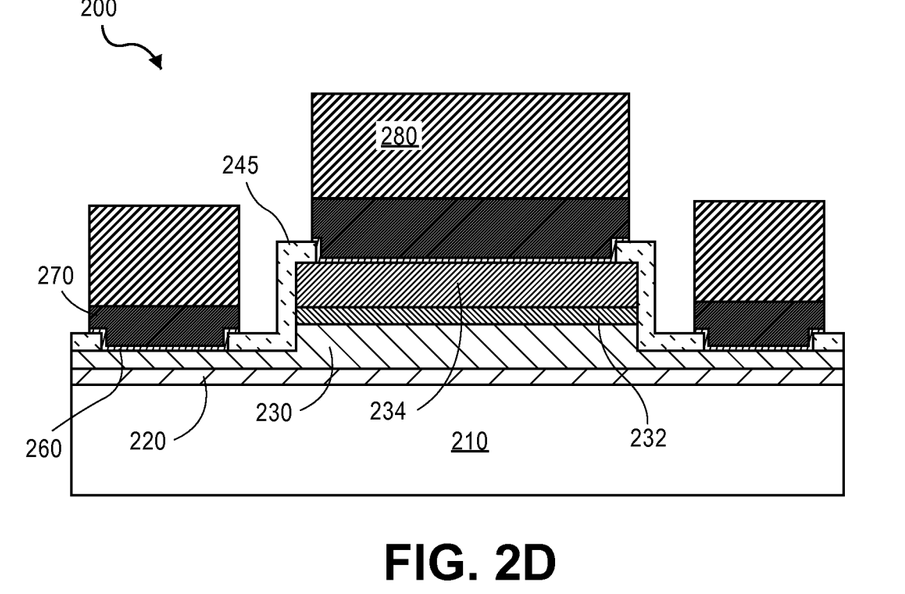
Figure 2E:
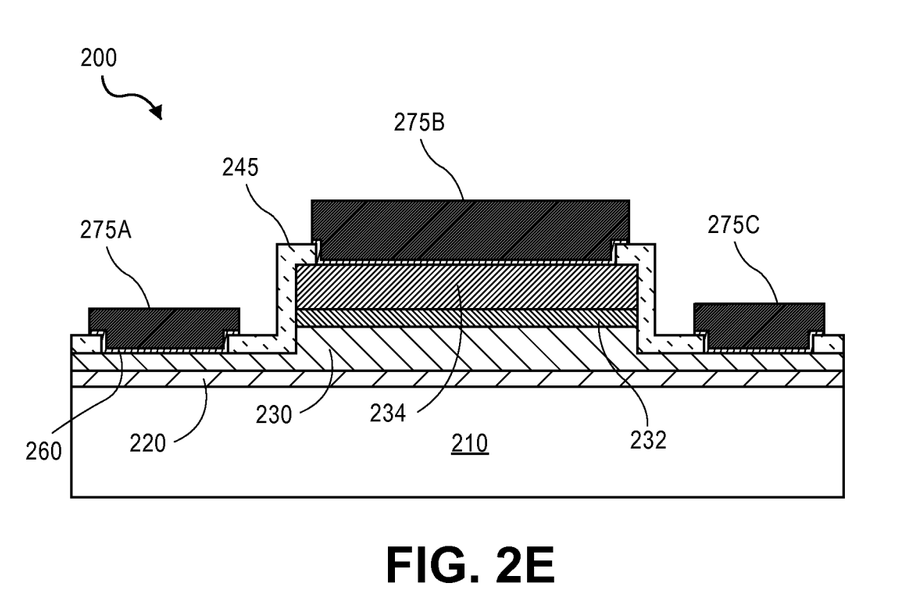
Figure 2F:
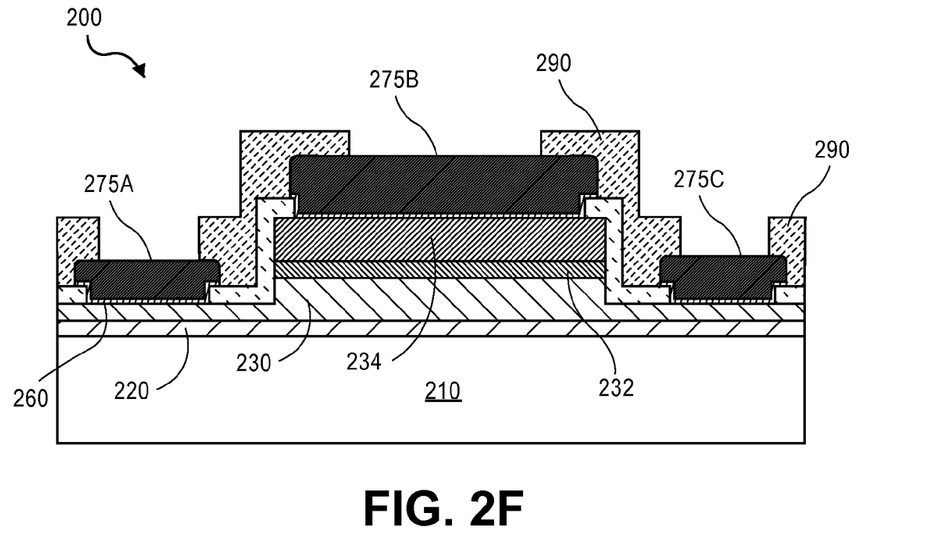

In FIG. 2D, the first and second metal layers 260 and 270 have been patterned by, for instance, a photoresist mask 280 and plasma etch, in which the photoresist 280 masks the regions over metal contact pattern areas 246a, 246b, and 246c (see FIG. 2A) of dielectric layer 245. Thus, the portions of first metal layer 260 and second metal layer 270 that were in between the photoresist mask 280 portions have been removed. In FIG. 2E the photoresist mask 280 has been stripped, leaving contacts 275a, 275b and 275c for the semiconductor device 200. Contacts 275a, 275b and 275c include both the first metal 260 and second metal 270 that were used to form the contacts. Contacts 275a and 275c are electrically connected to and serve as contacts for n-type layer 230. Similarly, contact 275b is electrically connected to and serves as a contact for p-type layer 234. Consequently, contacts 275a, 275b and 275c serve as external or device contacts for semiconductor device 200. Thus, the first metal layer and the second metal layer form contacts to both the n-type layer and the p-type layer. In some embodiments, the p-type layer includes a group III-nitride material, and the n-type layer may also include a group III-nitride material. In FIG. 2F a top passivation layer 290 is deposited and patterned using techniques known in the art, such that the passivation layer 290 surrounds the perimeters of contacts 275a, 275b and 275c.

By combining the contact and thick metal deposition steps of conventional techniques into a sequential process of depositing first and second metal layers, as in FIGS. 2A-2F, the number of photolithography steps required for device metallization is reduced from four to three. That is, to form the semiconductor device 200, photolithography is used to pattern the dielectric layer 245 (FIG. 2B), the first and second metal layers 260 and 270 using a single mask (FIG. 2D), and the passivation layer 290 (FIG. 2F). The simplified metallization process eliminates the metal-lift off step of conventional techniques (FIGS. 1A-1B), thereby avoiding potential issues with metal retention and re-deposition.

Figure 3:
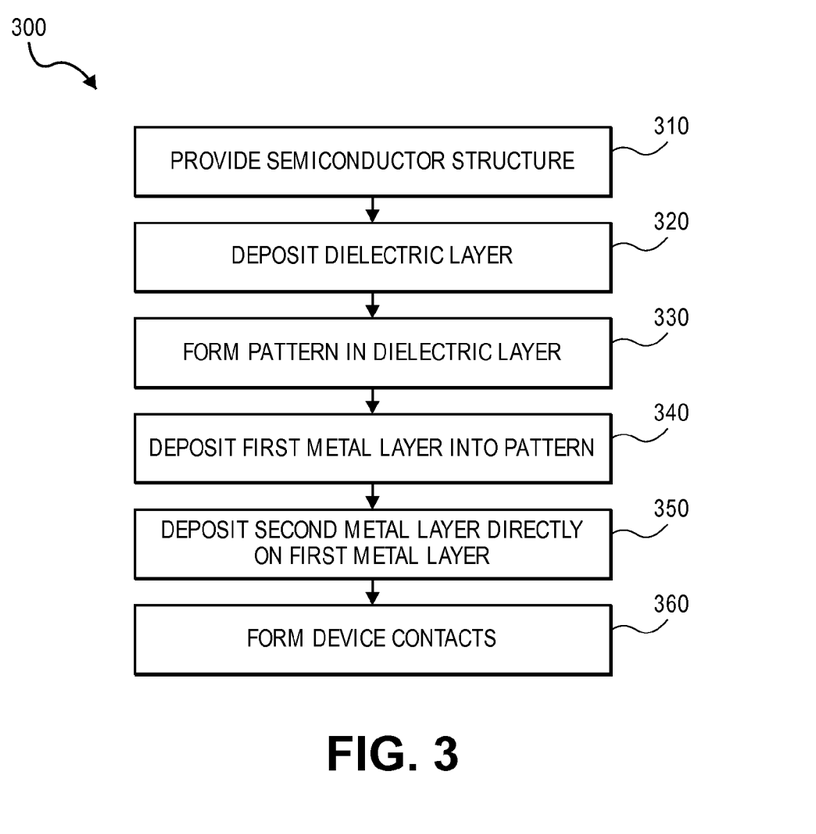
FIG. 3 is an exemplary flowchart representing methods for forming contacts corresponding to FIGS. 2A-2F.

FIG. 3 is an exemplary flowchart 300 representing methods for forming contacts as illustrated by FIGS. 2A-2F. A semiconductor structure is provided in step 310, where the structure includes an n-type layer and a p-type layer. In some embodiments, the semiconductor structure may be an opto-electronic device structure with an n-type layer, a p-type layer and a light generating structure between the n-type layer and the p-type layer. For example, the opto-electronic device may be a light emitting diode (LED). In step 320, a dielectric layer is deposited on the n-type layer and p-type layer. In step 330, a pattern is formed in the dielectric layer, where the pattern includes a plurality of metal contact patterns for the semiconductor device. For example, in some embodiments the pattern includes a p-contact pattern and an n-contact pattern, such as for an opto-electronic device. In step 340, a first metal layer is deposited into the plurality of metal contact patterns, such as by depositing the first metal layer on the dielectric layer, the n-contact pattern and p-contact pattern. The first metal may be, for example, titanium. A second metal layer is deposited directly on the first metal layer in step 350, where the second metal may be, for example, pure Al, AlCu, AlSi, or AlCuSi, of varying compositions as described above in relation to FIG. 2C. The first metal layer and the second layer are deposited using sequential processing.

In step 360, device contacts are formed that include the second metal layer. The device contacts serve as external contacts for the semiconductor device. In some embodiments, the device contacts are created by performing a masked etch removal of the first metal layer and second metal layer. The masked etch removal may include, for example, applying a pattern mask over the plurality of metal contact patterns, etching portions of the first metal layer and the second metal layer that are exposed by the pattern mask, and removing the pattern mask. In some embodiments, the masked etch removal includes using a pattern mask, the pattern mask being used to etch both the first metal layer and the second metal layer. In certain embodiments, the device contacts are defined by the p-contact pattern and n-contact pattern of the opto-electronic device. In some embodiments, contact formation is followed by annealing at a temperature in the range of 300-1000° C. to improve the contact mechanical and electrical properties.

A process sequence demonstrated by FIGS. 4A-4F shows how semiconductor metallization, such as for an LED, can be achieved using only two photolithography steps, in further embodiments. In these embodiments, a blanket deposition is performed of what would be considered combined contact and thick metallization layers in conventional techniques. The metallization layers are formed from the first and second metal layers in these embodiments. Following the metal layer depositions, wet chemical etching is employed to selectively remove metal in unwanted areas.

Figure 4A:
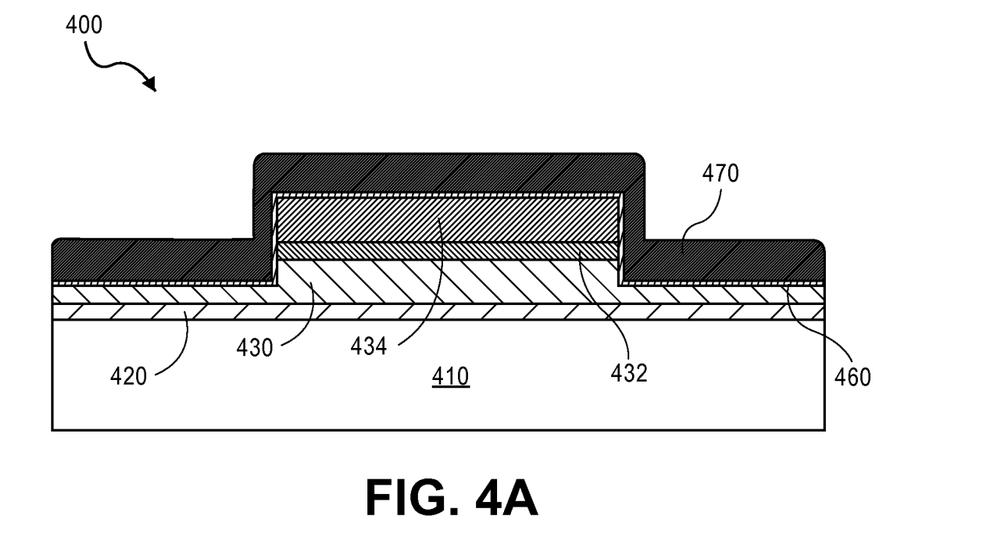
FIGS. 4A-4F show side cross-sectional views of another embodiment of forming contacts for a semiconductor device.

In FIG. 4A a semiconductor device 400 includes a substrate 410, a buffer layer 420, an n-type layer 430, an intrinsic layer 432 and a p-type layer 434. Semiconductor device 400 may be an opto-electronic device, such as an LED. Substrate 410 may be, for example, silicon, sapphire, silicon carbide or a group III-nitride such as aluminum nitride. In some embodiments, the p-type layer 434 includes a group III-nitride material, and the n-type layer 430 may also include a group III-nitride material. First metal layer 460 is deposited on the device structure, such as onto the n-type layer 430 and p-type layer 434. Second metal layer 470 is then deposited directly on first metal layer 460. Deposition of the first metal layer 460 and second metal layer 470 can be performed sequentially in a single process step. The metals for these layers may be the same as described above in relation to FIGS. 2A-2F, such as the first metal layer 460 being titanium and the second metal layer 470 being pure Al, or varying compositions of AlCu, AlSi, or AlCuSi. The thicknesses of the metal layers 460 and 470 may also be the same as previously described, such as up to 100 nm for first metal layer 460 and at least 300 nm for second metal layer 470.

Figure 4B:
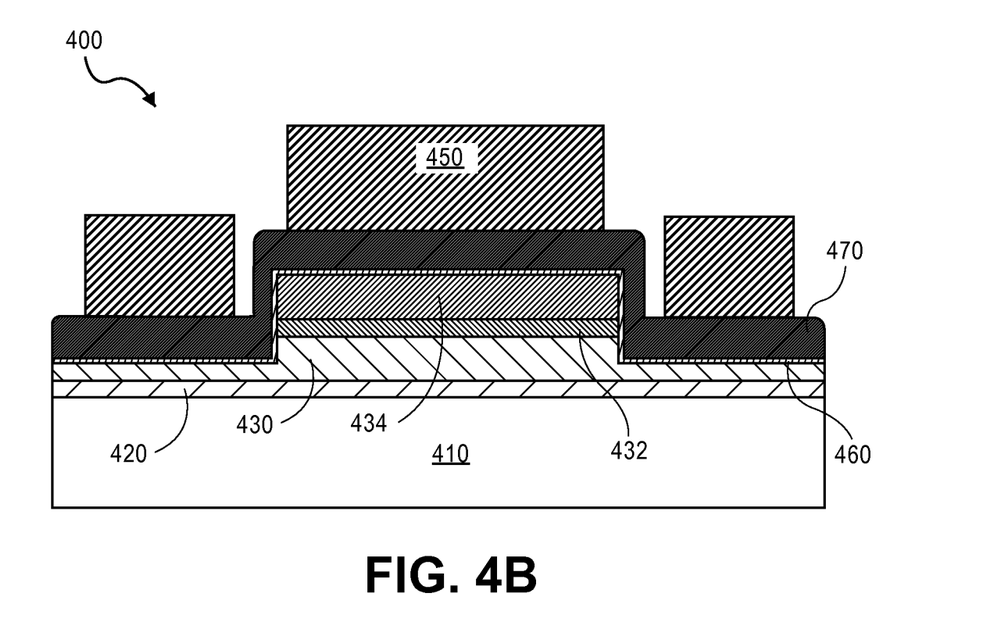
Figure 4C:
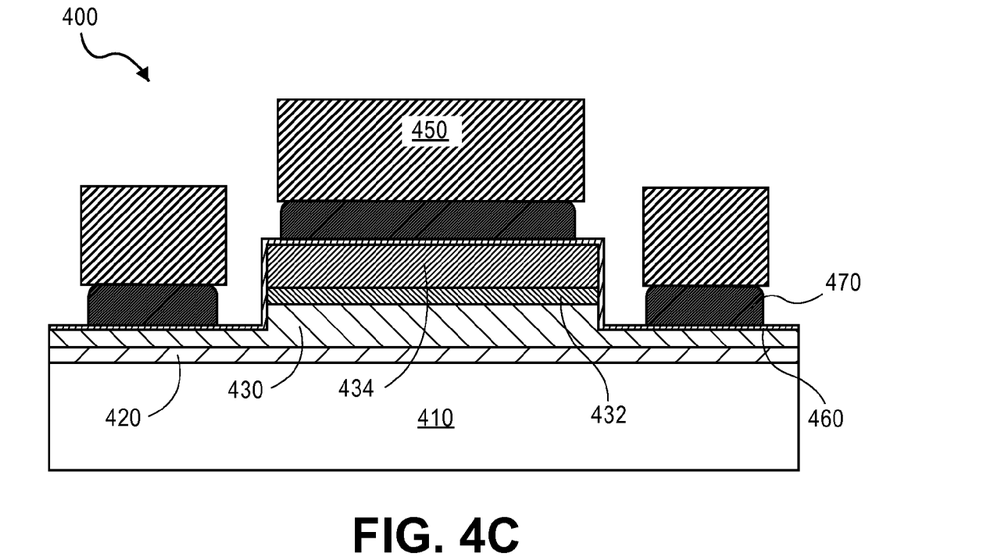
Figure 4D:
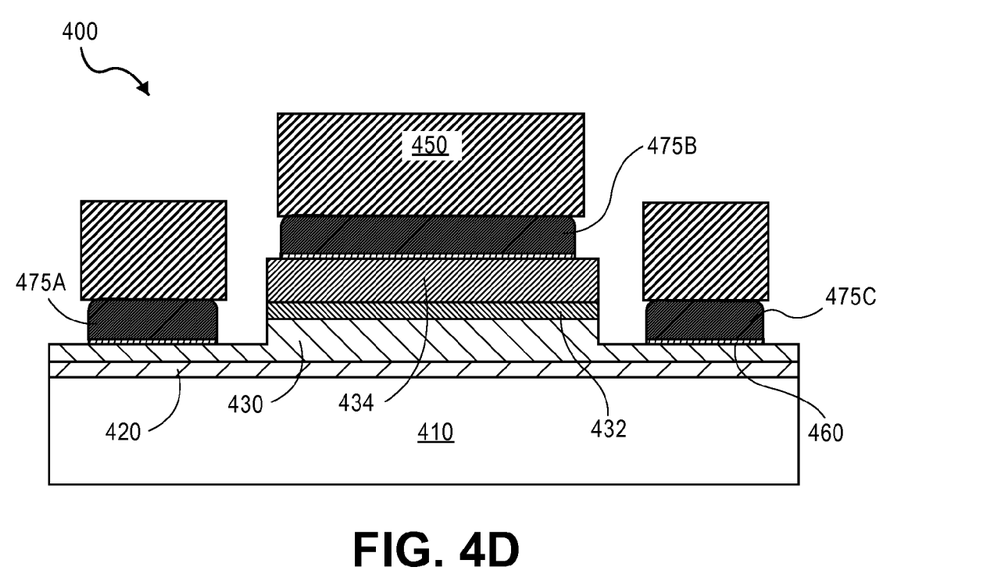

In FIG. 4B, patterning of the first metal layer 460 and the second metal layer 470 is performed by applying a photoresist 450. The photoresist 450 shown in FIG. 4B has already been etched, such as by lithography, to create a pattern in which photoresist 450 remains only in the areas where contact metal material is desired to be preserved. In FIG. 4C the second metal layer 470 is etched first, where the etching removes portions of the second metal layer 470 that are exposed by photoresist 450. For example, if the second metal layer is AlCuSi, removal may be achieved by a wet chemical etch using phosphoric acid ($H_3PO_4$) at approximately 70-120° C. for up to 10 minutes. In FIG. 4D, portions of the first metal layer 460 (shown in FIG. 4C) are removed in areas exposed by photoresist 450. For example, if first metal layer 460 is titanium, a wet chemical etch using a hydrofluoric (HF) acid dip may be used at approximately 25° C. for up to 10 minutes. In some embodiments, the HF acid may be a 10:1 dilute solution, and the dip may have a duration of less than 1 minute. Etching of the first metal layer 460 in FIG. 4C results in device contacts 475a, 475b, and 475c, in FIG. 4D which are the patterned portions of both the first and second metal layers 460 and 470. Selective metal removal through wet chemical etching is inherently a high throughput process due to the ability to process a batch of wafers in a chemical bath. Thus, the formation of metal contact patterns by wet chemical etching, as shown in FIGS. 4C-4D, increases manufacturing rates. In further embodiments, additional process simplification may be achieved by removal of the first metal layer and photoresist stripping (FIGS. 4D and 4E) in a single wet chemical process step. In further embodiments, the first metal layer and the second metal layer are removed using a plasma etch.

Figure 4E:
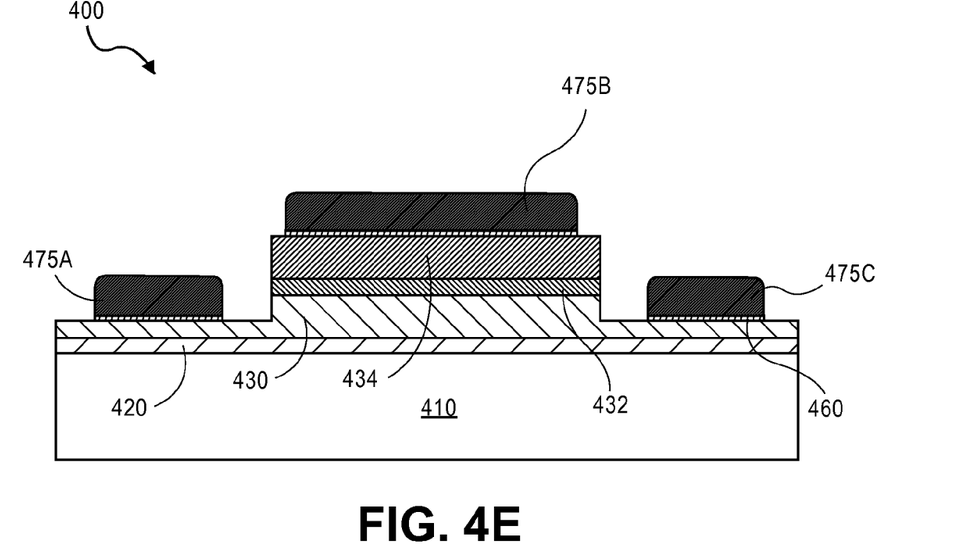
Figure 4F:
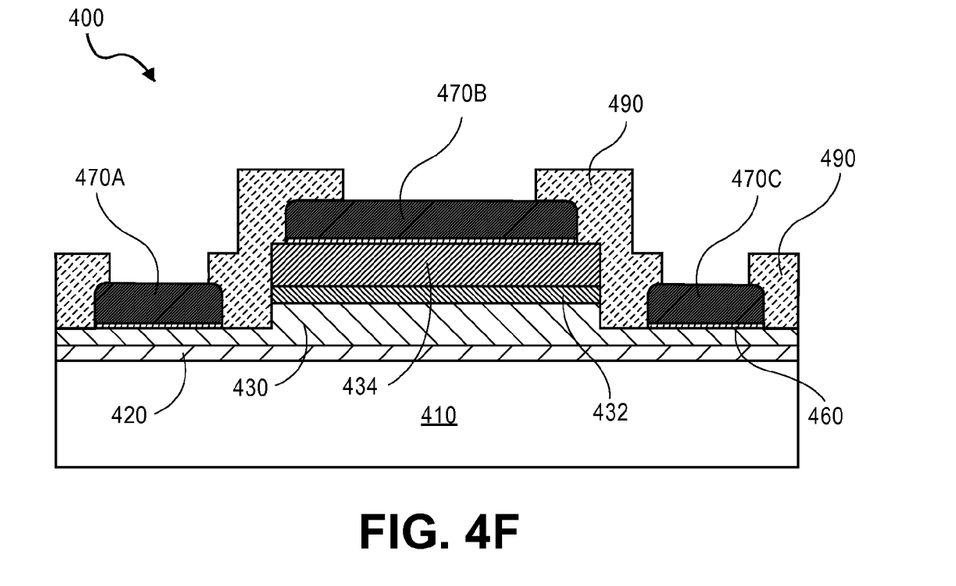

In FIG. 4E the photoresist 450 has been removed, or stripped, from the top surfaces of device contacts 475a, 475b, and 475c. In FIG. 4F a top passivation layer 490 is deposited and patterned, such that the passivation layer 490 surrounds the perimeters of device contacts 475a, 475b and 475c.

Figure 5:
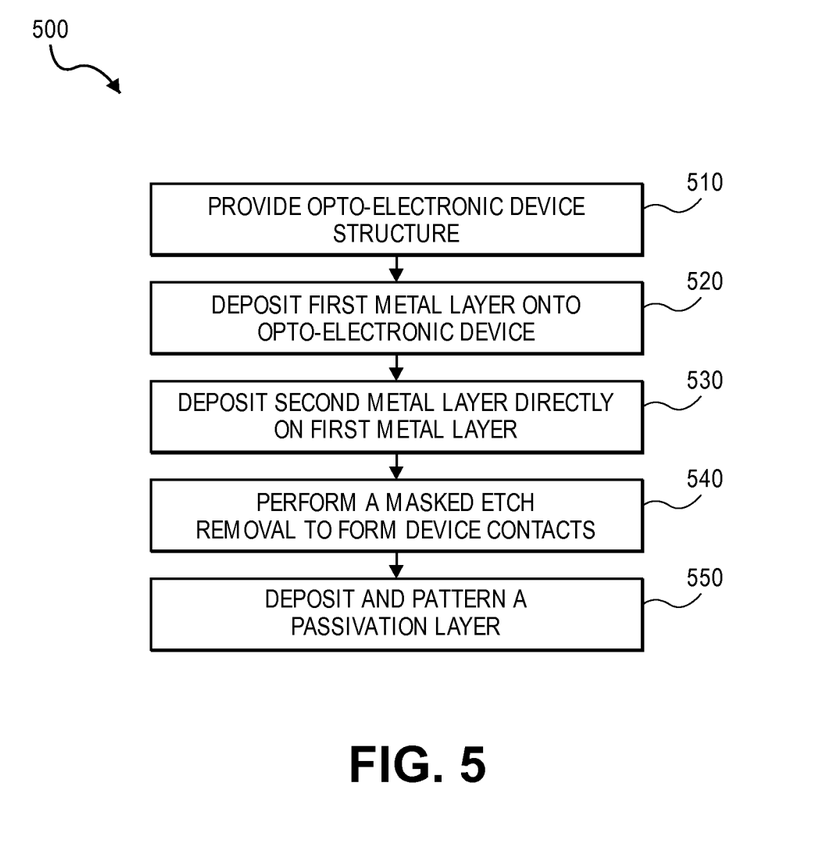
FIG. 5 is an exemplary flowchart representing methods for forming contacts corresponding to FIGS. 4A-4F.

FIG. 5 is an exemplary flowchart 500 representing methods for forming contacts as illustrated by FIGS. 4A-4F. A semiconductor structure is provided in step 510, where the structure comprises an n-type layer and a p-type layer. In some embodiments, the semiconductor structure may be an opto-electronic device structure with an n-type layer, a p-type layer and a light generating structure between the n-type layer and the p-type layer. For example, the opto-electronic device may be a light emitting diode (LED). In step 520, a first metal layer is deposited directly on the opto-electronic device structure, such as on the n-type layer and the p-type layer. The first metal may be, for example, titanium. A second metal layer is deposited directly on the first metal layer in step 530, where the second metal may be pure Al, AlCu, AlSi, or AlCuSi, of varying compositions as described in relation to FIG. 2C. The first metal layer and the second layer are deposited using sequential processing.

In step 540, device contacts are created by performing a masked etch removal of the first metal layer and second metal layer. A single mask is used for both the first metal layer and second metal layer, to form device contacts for the opto-electronic device. In some embodiments, the masked etch removal includes removing a first metal layer of titanium using hydrofluoric acid at approximately 25° C. for up to 10 minutes. In certain embodiments, the HF acid may be a 10:1 dilute solution. In other embodiments, the masked etch removal comprises removing a second metal layer of AlCuSi using $H_3PO_4$ at approximately 70-120° C. for up to 10 minutes. Optionally, in step 550 the device may be further processed by depositing a passivation layer directly onto the opto-electronic device structure and the device contacts, and patterning the passivation layer to expose the device contacts. The masked etch removal may include, for example, applying a pattern mask over the plurality of metal contact patterns, etching portions of the first metal layer and the second metal layer that are exposed by the pattern mask, and removing the pattern mask. In some embodiments, the masked etch removal includes using a pattern mask, the pattern mask being used to etch both the first metal layer and the second metal layer. In certain embodiments, the device contacts are defined by the p-contact pattern and n-contact pattern of the opto-electronic device. In some embodiments, contact formation is followed by annealing at a temperature in the range of 300-1000° C. to improve the contact mechanical and electrical properties.

It is commonly believed that metals with different work functions should be used for contacting the n and p regions of III-nitride materials. This view is based on the assumption that Schottky barrier heights depend on the work functions of the contact metals. Usually metals with work functions less than that of n-GaN such as Ti, Al, Ta and V are used for contacting n-type material, whereas high work function metals such as Ni, Au, Pd and Pt are used for contacts to p-type material. Thus, application of Ti/AlCuSi contacts for both n-type and p-type regions is a departure from conventional practice. The use of the same metal stack for both the n- and p-contacts enables a more efficient metallization scheme than conventional techniques in which separate processes are required to deposit different metals for the n- and p-contacts. An added benefit of Ti/AlCuSi contacts is avoidance of Au and device reliability problems related to contacts containing Au.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the scope of the present invention. Furthermore, those of ordinary skill in the art will appreciate that the foregoing description is by way of example only, and is not intended to limit the invention. Thus, it is intended that the present subject matter covers such modifications and variations.

What is claimed is:

1. A method of forming contacts to an n-type layer and a p-type layer of a semiconductor device, comprising:
    depositing a dielectric layer on the n-type layer and the p-type layer;
    forming a pattern in the dielectric layer, the pattern comprising a plurality of metal contact patterns for the semiconductor device;
    depositing a first metal layer into the plurality of metal contact patterns, wherein the first metal layer is directly on the n-type layer and the p-type layer;
    depositing a second metal layer directly on the first metal layer; and
    forming external contacts for the semiconductor device, the external contacts comprising the second metal layer.

2. The method of claim 1, wherein the plurality of metal contact patterns comprises an n-contact and a p-contact for an opto-electronic device.

3. The method of claim 1, wherein the first metal layer is titanium.

4. The method of claim 3, wherein the second metal layer is AlCuSi.

5. The method of claim 4, wherein the first metal layer has a thickness of up to 100 nm, and the second metal layer has a thickness of at least 300 nm.

6. The method of claim 4, wherein the first metal layer and the second metal layer form contacts to the n-type layer and the p-type layer, and wherein the p-type layer comprises a group III-nitride material.

7. The method of claim 1, further comprising:
    applying a pattern mask over the plurality of metal contact patterns;
    etching portions of the first metal layer and portions of the second metal layer that are exposed by the pattern mask; and
    removing the pattern mask.

8. A method of forming contacts to an n-type layer and a p-type layer of a semiconductor opto-electronic device, comprising:
    providing an opto-electronic device structure with an n-type layer, a p-type layer and a light generating structure between the n-type layer and the p-type layer;
    depositing a dielectric layer on the n-type layer and the p-type layer of the opto-electronic device structure;
    forming a pattern in the dielectric layer, the pattern comprising a p-contact pattern and an n-contact pattern;
    depositing a first metal layer onto the dielectric layer, directly onto the n-type layer in the n-contact pattern and directly onto the p-type layer in the p-contact pattern;
    depositing a second metal layer directly on the first metal layer; and
    performing a masked etch removal of the first metal layer and the second metal layer to form device contacts for the opto-electronic device, the device contacts being defined by the p-contact pattern and the n-contact pattern.

9. The method of claim 8, wherein the first metal layer and the second layer are deposited using sequential processing.

10. The method of claim 8, wherein the masked etch removal comprises using a pattern mask, the pattern mask being used to etch both the first metal layer and the second metal layer.

11. The method of claim 8, wherein the dielectric layer covers side walls of the opto-electronic device structure.

12. The method of claim 8, wherein the first metal layer is deposited directly into the p-contact pattern and the n-contact pattern.

13. The method of claim 8, wherein the first metal layer is titanium.

14. The method of claim 13, wherein the second metal layer is AlCuSi.

15. The method of claim 14 wherein the titanium is at least 99.0% pure, and the second metal layer comprises 0-10% copper, 0-5% silicon, and up to 100% aluminum.

16. The method of claim 8, wherein the opto-electronic device is a light emitting diode.

* * * * *